(12) United States Patent
Shu

(10) Patent No.: US 8,917,489 B2
(45) Date of Patent: *Dec. 23, 2014

(54) APPARATUS AND METHOD FOR HOLDING A WAFER

(71) Applicant: Semiconductor Manufacturing International Corp., Shanghai (CN)

(72) Inventor: Emily Shu, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/649,576

(22) Filed: Oct. 11, 2012

(65) Prior Publication Data
US 2013/0100572 A1    Apr. 25, 2013

(30) Foreign Application Priority Data
Oct. 19, 2011    (CN) .......................... 2011 1 0319207

(51) Int. Cl.
  *H01T 23/00*  (2006.01)
  *H01L 21/683*  (2006.01)
  *H01L 21/67*  (2006.01)

(52) U.S. Cl.
  CPC ...... *H01L 21/6833* (2013.01); *H01L 21/67288* (2013.01)
  USPC .......................................................... 361/234

(58) Field of Classification Search
  USPC .......................................................... 361/234
  See application file for complete search history.

(56) References Cited

U.S. PATENT DOCUMENTS

| 5,872,694 A | * | 2/1999 | Hoinkis et al. | 361/234 |
| 5,886,866 A | * | 3/1999 | Hausmann | 361/234 |
| 2010/0093161 A1 | * | 4/2010 | Kusumoto et al. | 438/522 |
| 2010/0277850 A1 | * | 11/2010 | Chang et al. | 361/234 |

* cited by examiner

*Primary Examiner* — Stephen W Jackson
(74) *Attorney, Agent, or Firm* — Anova Law Group, PLLC (57) ABSTRACT

An apparatus and a method for holding a wafer are provided in this disclosure. The wafer holding apparatus includes: an electrostatic chuck, the electrostatic chuck having a plurality of concentric zones; a plurality of power supply units, each adapted for applying a voltage to one of the zones of the electrostatic chuck independently; and a control unit, adapted for controlling each of the power supply units independently to start or stop applying the voltage to a corresponding zone of the electrostatic chuck. Surface flatness is improved when the wafer is chucked on the wafer holding apparatus according to the disclosure, and the risk of particle contamination can be reduced when the wafer is flattened and gets back into warpage from flatness.

19 Claims, 9 Drawing Sheets

APPARATUS AND METHOD FOR HOLDING A WAFER

CROSS REFERENCE TO RELATED APPLICATIONS

The present application claims priority to Chinese patent application No. CN201110319207.1, filed on Oct. 19, 2011, and entitled "Apparatus and Method for Holding a Wafer", the entire disclosure of which is incorporated herein by reference.

FIELD OF THE DISCLOSURE

The present disclosure generally relates to semiconductor manufacturing technology and, more particularly, to an apparatus and method for holding a wafer.

BACKGROUND

According to Moore's Law, the number of transistors per silicon chip doubles every 18 months, and the sizes of devices decrease in proportion to a factor of approximately 0.7 every three years.

Larger wafers hold more chips and can reduce per-chip cost. 300 mm wafers are now commonly used in semiconductor manufacturing processes and the industry is pushing for an even larger wafer size of 450 mm in diameter.

Although the wafers having large sizes, such as 300 mm, 450 mm, or even larger, can be used to reduce manufacturing cost, larger wafers introduce new issues that were not previously considered in smaller wafers. One critical issue is the wafer warpage which has become more severe with 300 mm or larger wafers.

Wafer warpage causes many undesired manufacturing defects. For example, a spun-on layer on the wafer may have a larger thickness at the centre than the outer edge. In an etching process, critical dimension (CD) uniformity problem from wafer center to edge at least partly comes from imperfect chucking over wafer warpage. And in a photolithographic process, a photoresist (PR) layer's thickness uniformity from wafer centre to outer edge is critical. During exposure, wafer warpage induced focus drift can be disastrous for CD uniformity. An electrostatic chuck (also referred to as ESC or e-chuck) is often employed to solve the problem of wafer warpage in the semiconductor manufacturing process.

However, an electrostatic chuck often suffers from chucking uniformity and particle contamination while performing a flattening process on the wafer. Therefore, there is a need to provide methods for avoiding undesired effects in wafer chucking.

SUMMARY

Embodiments of the present disclosure provide an apparatus and a method for holding a wafer to reduce the risk of particle contamination.

One embodiment of the present disclosure provides a wafer holding apparatus. The wafer holding apparatus includes an electrostatic chuck, a plurality of power supply units, and a control unit. The electrostatic chuck has a plurality of concentric zones. Each of the power supply units is adapted for applying a voltage to one of the zones of the electrostatic chuck independently. The control unit is adapted for controlling each of the power supply units independently to start or stop applying the voltage to a corresponding zone of the electrostatic chuck. The wafer holding apparatus further includes a wafer flatness measuring unit configured to measure the chucked wafer flatness data. The voltages are applied to corresponding zones based on the wafer flatness data.

The control unit includes a data reception and storage unit, a detecting unit, and calculating unit. The data reception and storage unit is adapted for receiving and storing wafer flatness data. The control unit may control each of the power supply units to reduce the intensity of the voltage in a linear descending way gradually until the power supply is stopped. Optionally, a multi-step descending way or a curved descending way may be employed.

Another embodiment of the present disclosure provides a method for holding a wafer. The method includes the following steps. An electrostatic chuck is provided which has a plurality of concentric zones. A wafer is provided to be chucked by the electrostatic chuck. Wafer flatness data is obtained. Then, a holding or a release pattern is selected for each zone of the electrostatic chuck independently based on the wafer flatness data, to reduce the chucked wafer warpage and to de-chuck the wafer smoothly.

DETAILED DESCRIPTION OF THE DISCLOSURE

Reference will now be made in detail to exemplary embodiments of the invention, which are illustrated in the accompanying drawings.

Figure 1:
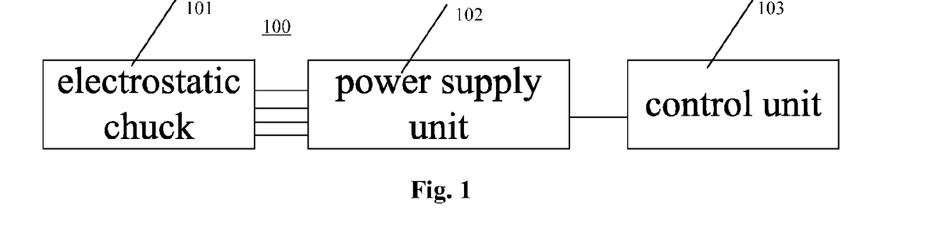
FIG. 1 is a schematic block view of an electrostatic chuck, its power supply unit and control unit according to an embodiment of the present disclosure.

FIG. 1 illustrates an exemplary apparatus for holding a wafer according to embodiments of the present disclosure. As shown in FIG. 1, the wafer holding apparatus 100 includes an electrostatic chuck 101, a plurality of power supply units 102 and a control unit 103. Other components may also be included.

The electrostatic chuck 101 may include any appropriate type of electrostatic chuck, such as one having a plurality of zones. Each of the power supply units 102 may be adapted for applying a voltage to one of the zones of the electrostatic chuck independently. And the control unit 103 may perform certain control functions of the wafer holding apparatus 100. For example, the control unit 103 may be adapted for controlling each of the power supply units independently to start or stop applying the voltage to a corresponding zone of the electrostatic chuck 101.

Figure 2:
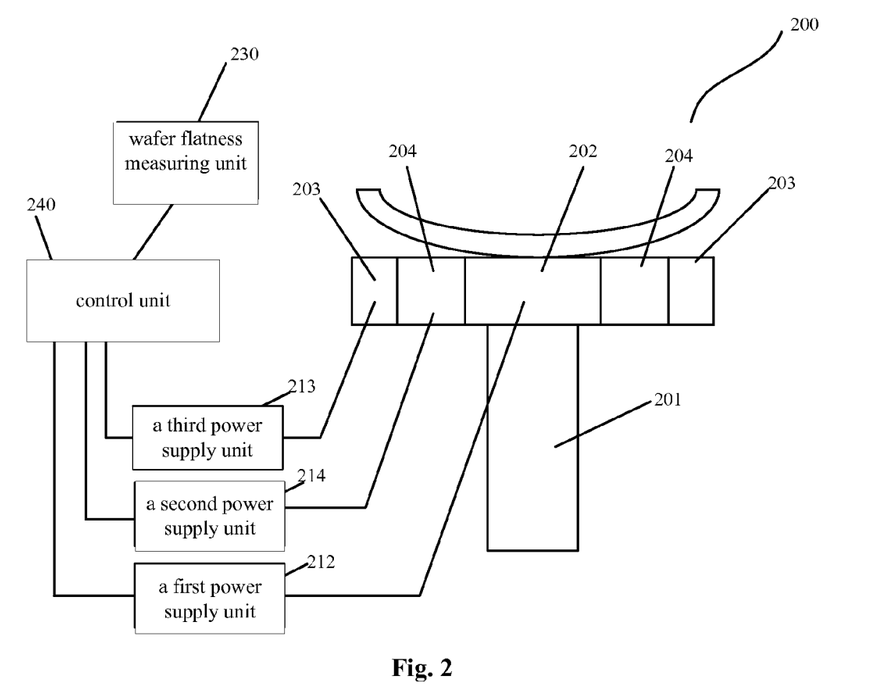
FIG. 2 is a schematic view illustrating an electrostatic chuck for holding a wafer according to one embodiment of the present disclosure.

FIG. 2 illustrates another exemplary wafer holding apparatus 200 with more details. As shown in FIG. 2, the wafer holding apparatus 200 includes an electrostatic chuck 201 having a plurality of zones, a plurality of power supply units 212, 213 and 214, a wafer flatness measuring unit 230, and a control unit 240.

Electrostatic chuck 201 includes a base plate (not labeled), which is separated into a plurality of zones 202, 203, and 204, etc. The base plate also include a plurality of electrodes (not shown), corresponding to the plurality of zones in the base plate, and an insulating layer (not shown) to insulate the electrodes and/or wafer from the base plate.

The base plate is configured to support the electrodes and the insulating layer, and the insulating layer may form a dielectric between the electrodes and the wafer. The base plate may also perform other functions. For example, the base may be connected to a radio frequency (RF) bias which serves as a heater source or a cooler source for the wafer.

When the electrostatic chuck 201 is controlled to hold a wafer, the power supply units 212, 213 and 214 provide a voltage to the corresponding electrode. Being powered by the power supply units 212, 213 and 214, the electrodes generate Coulomb force or Johnsen-Rahbek force between the wafer and electrodes such that the wafer can be fixed or chucked on the base plate of the electrostatic chuck 201.

The base plate of the electrostatic chuck 201 may have a circular shape identical to or slightly larger than the wafer. Optionally, electrostatic chuck 201 may have a square or rectangular shape. Any appropriate geometric shapes may be used.

Figure 3:
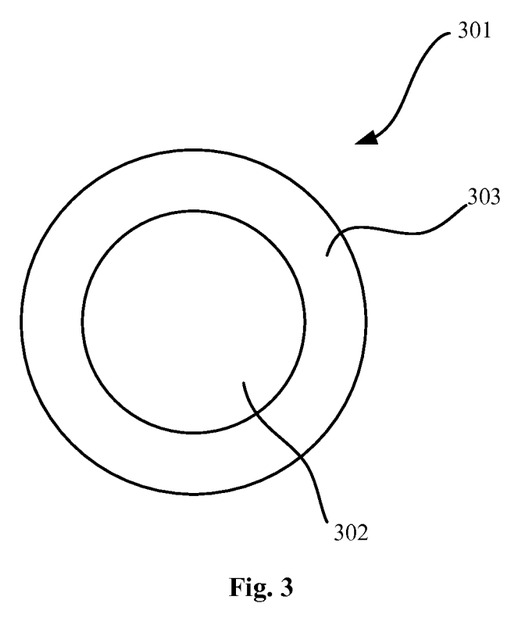
FIG. 3 is a schematic view illustrating zones arranged on an exemplary electrostatic chuck for holding a wafer of the present disclosure.

Because a wafer to be processed usually has a circular shape, for illustrative purposes, the electrostatic chuck 201 having a circular shape base plate may be described in this disclosure. As described above, the base plate of the electrostatic chuck 201 may have a plurality zones. For a circular shape, the base plate may have a plurality of concentric zones. FIG. 3 illustrates an exemplary base plate zones consistent with the disclosed embodiments.

As shown in FIG. 3, electrostatic chuck 301 (i.e., the base plate of the electrostatic chuck 301) includes a center zone 302 and an outer zone 303. The center zone 302 and the outer zone 303 are concentric. The center zone 302 is a circular area which is at the center of electrostatic chuck 301 and has a radius less than that of electrostatic chuck 301, and the remaining ring area is outer zone 303.

Figure 4:
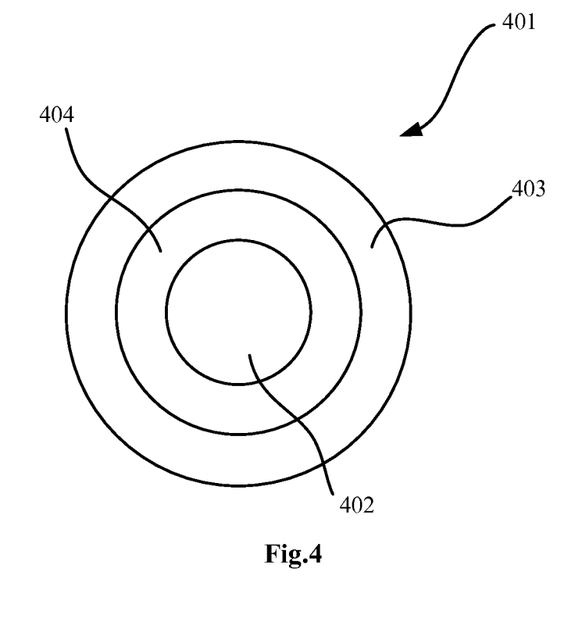
FIG. 4 is a schematic view illustrating zones arranged on another exemplary electrostatic chuck for holding a wafer of the present disclosure.

FIG. 4 illustrates another exemplary base plate zones consistent with the disclosed embodiments. As shown in FIG. 4, electrostatic chuck 401 includes a center zone 402, an outer zone 403, and an intermediate zone 404 between center zone 402 and outer zone 403. The center zone 402, the intermediate zone 404 and the outer zone 403 are concentric. The center zone 402 is a circular area which is at the center of electrostatic chuck 401 and has a radius less than that of electrostatic chuck 401. The intermediate zone 404 is a part of ring area except center zone 402, and the remaining ring area is outer zone 404. Thus, the intermediate zone 404 is a ring configured between the center zone 402 and the outer zone 403.

Figure 5:
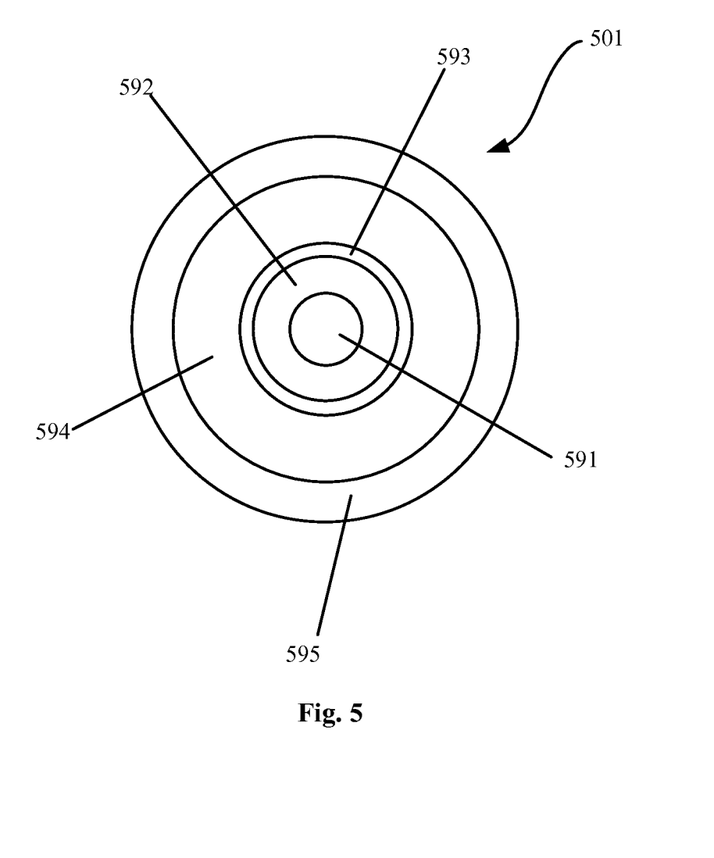
FIG. 5 is a schematic view illustrating zones arranged on still another exemplary electrostatic chuck for holding a wafer of the present disclosure.

FIG. 5 illustrates another exemplary base plate zones consistent with the disclosed embodiments. As shown in FIG. 5, electrostatic chuck 501 includes a first zone 591, a second zone 592, a third zone 593, a fourth zone 594 and a fifth zone 595. The first zone 591 is a circular area which is at the center of electrostatic chuck 501 and has a radius less than that of electrostatic chuck 501. The second zone 592, the third zone 593, the fourth zone 594 and the fifth zone 595 are ring areas surrounding the first zone 591 sequentially. The first zone 591, the second zone 592, the third zone 593, the fourth zone 594 and the fifth zone 595 constitute surface of electrostatic chuck 501.

It should be noted that the electrostatic chuck may be configured by those skilled in the art according to the practical requirements to have any appropriate number of zones, such as 4, 6, 7, 10, or 20 zones, etc.

Returning to FIG. 2, the base plate of the electrostatic chuck 201 includes a plurality of zones 202, 203, and 204. In certain embodiments, the plurality zones 202, 203, and 204 may refer to a center zone 202, an outer zone 203, and an intermediate zone 204. Other configurations may also be used.

Further, the first power supply unit 212, the second power supply unit 214, and the third power supply unit 213 of the wafer holding apparatus 200 are electrically coupled to electrodes arranged in center zone 202, intermediate zone 204, and outer zone 203, respectively. Thus, the first power supply unit 212, the second power supply unit 214, and the third power supply unit 213 also control power/voltage to the center zone 202, the intermediate zone 204, and the outer zone 203, respectively. More specifically, the first power supply unit 212, the second power supply unit 214 and the third power supply unit 213 are voltage applying devices which apply voltages to corresponding zones so that center zone 202, intermediate zone 204 and outer zone 203 may generate Coulomb force or Johnsen-Rahbek force.

It should be noted that the first power supply unit 212, the second power supply unit 214 and the third power supply unit 213 may be operated independently. Voltages applied by each of the power supply units may be adjusted independently within an adjustable limit without influencing the other power supply units. That is, each power supply unit may supply a voltage to a corresponding zone for a certain time period and at a certain voltage level. Optionally, the first power supply unit 212, the second power supply unit 214 and the third power supply unit 213 may apply voltages to the zones of electrodes synchronously.

The plurality of power supply units capable of being operated independently has the following advantages. Voltages may be applied to corresponding zones like center zone 202, intermediate zone 204 and outer zone 203 based on wafer warpage, so that a desired effect of holding the wafer (e.g., flattening the wafer) by the electrostatic chuck will be achieved.

Figure 6:
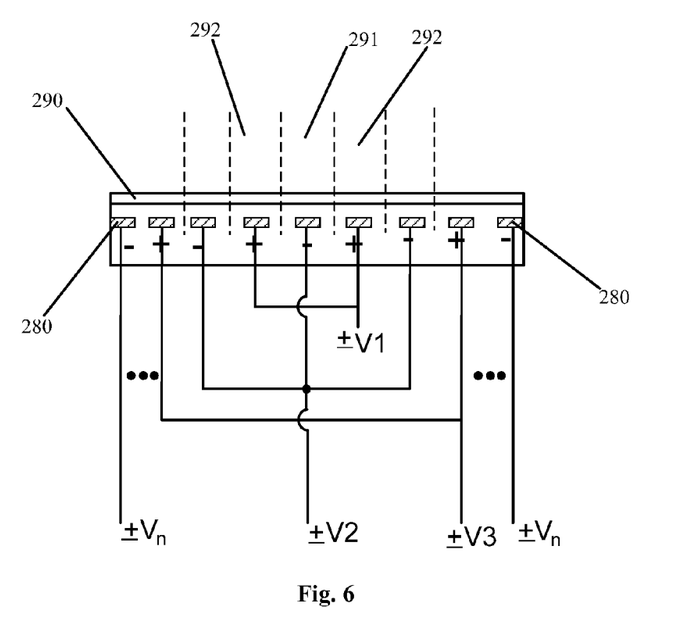
FIG. 6 is a schematic cross-sectional view illustrating zones of an electrostatic chuck connecting to power supply units according to one embodiment of the present disclosure.
Figure 7:
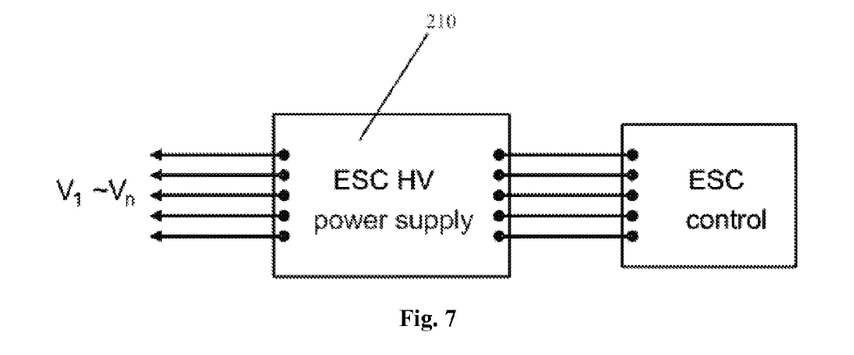
FIG. 7 is a schematic block view of a power supply unit of an electrostatic chuck for holding a wafer according to one embodiment of the present disclosure.

FIG. 6 is a schematic cross-sectional view illustrating zones of an electrostatic chuck connecting to power supply units according to disclosed embodiments. Referring to FIG. 6, an electrostatic chuck including n zones is taken as an example. The electrostatic chuck includes a first zone 291, a second zone 292, . . . , and an $n^{th}$ zone, where n is the total number of zones of the electrostatic chuck. The electrostatic chuck further includes a base plate (not labeled), a plurality of electrodes 280 corresponding to the zones arranged in the base plate, and an insulating layer 290 forming a dielectric between the electrodes 280 and the wafer held on the electrostatic chuck. Each of electrodes 280 may be electrically isolated from each other.

Figure 9:
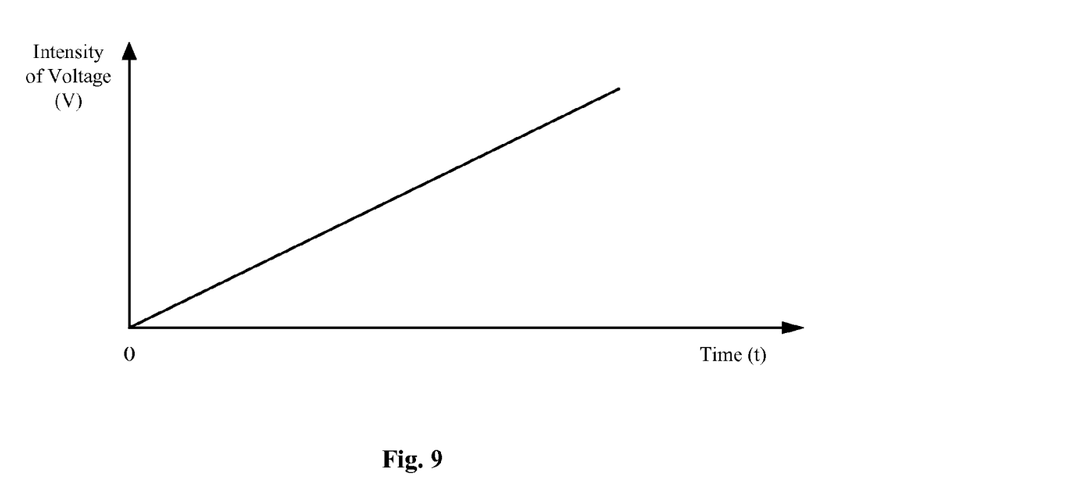
FIG. 9 is a schematic view illustrating the turning-on intensity in a linear ascending pattern of various zones in the electrostatic chuck according to one embodiment of the present disclosure.

Further, a voltage supply for ±V1 is applied to the second zone 292, a voltage supply for ±V2 is applied to the first zone 291 and the third zone 293, . . . , and a voltage supply for ±Vn is applied to the $n^{th}$ zone. Referring to FIG. 9, voltages applied to various zones are supplied by various power supply units 210. Power supply units 210 may apply voltages independently to n zones of the electrostatic chuck.

By controlling a plurality of power supply units 210 to apply voltages independently to electrodes 280 in the e-chuck, Coulomb force may be generated in a Coulomb chuck or Johnsen-Rahbek force may be generated in a J-R chuck, so that a warped wafer may be held by the electrostatic chuck tightly and may be flattened by the electrostatic chuck.

It should be noted that the number of the plurality of power supply units 210 depends on the number of the plurality of zones of the electrostatic chuck. For example, if the electrostatic chuck includes a center zone and an outer zone, the number of the plurality of power supply units is 2 correspondingly, which are connected to the center zone and the outer zone respectively. And if the electrostatic chuck includes 4, 5, 6, . . . , or 10 zones, the number of the plurality of power supply units is 4, 5, 6, . . . , or 10 accordingly, but the present disclosure is not limited thereto.

Returning to FIG. 2, the wafer flatness measuring unit 230 is configured to measure flatness, warpage, and profile of a wafer. The wafer flatness measuring unit 230 may include an optical scanning device, a wafer stress monitoring device.

When the wafer flatness measuring unit 230 is an optical scanning device, wafer flatness measuring unit 230 includes an optical scanning unit, a receiver, and a processor. The scanning unit scans the wafer loaded on the electrostatic chuck, and the scanning unit may be a digital camera, a high-precision scanner, or a high-precision camera or a laser emitting device. For example, the laser emitting device emits a laser beam, and the laser reflected by the wafer is detected by the receiver of the optical scanning device. The receiver receives the reflected laser beam and sends data to the processor of the optical scanning device for processing, and thus the loaded wafer flatness data can be obtained by the processor.

When the optical scanning unit is a digital camera, a high-precision scanner, or a high-precision camera, the position information of the loaded wafer can be directly obtained by the optical scanning unit and sent to the processor of the optical scanning device. The processor compares the position information with standard wafer information stored in memory to derive flatness data of the loaded wafer.

Figure 16:
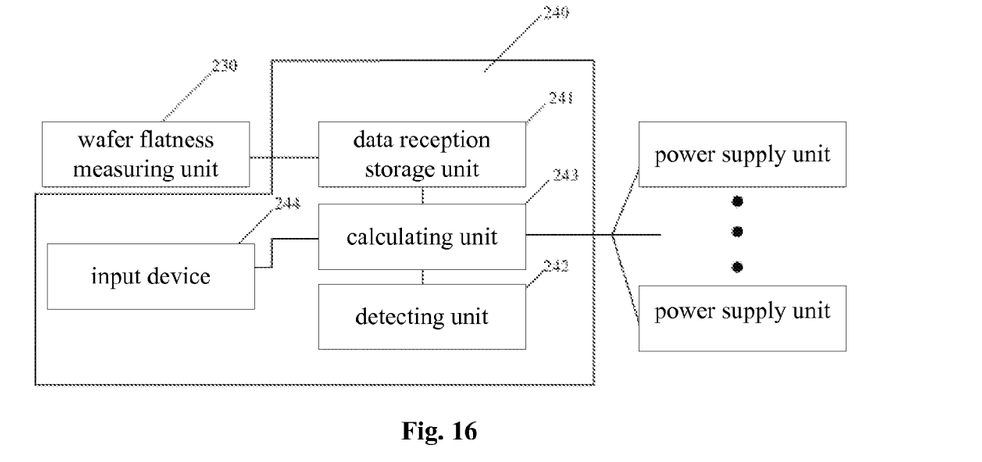
FIG. 16 is a schematic block view of a control unit of an in-situ monitored electrostatic chuck according to one embodiment of the present disclosure.

After obtaining the flatness data of the loaded wafer, the wafer flatness measuring unit 230 transmits the flatness data to the control unit 240. Control unit 240 is configured to control the first power supply units 212, the second power supply units 214, and the third power supply units 213 to start or stop applying voltages to corresponding zones. And control unit 240 controls the first power supply units 212, the second power supply units 214, and the third power supply units 213 independently. FIG. 16 illustrates an exemplary control unit 240 consistent with the disclosed embodiments.

As shown in FIG. 16, the control unit 240 includes a data reception and storage unit 241, a detecting unit 242, and a calculating unit 243. Data reception and storage unit 241 is configured to receive the wafer flatness data from the wafer flatness measuring unit 230 and store the received wafer flatness data. Data reception and storage unit 241 may be any suitable storage device, such as a hard disk, a memory, or a flash memory.

Detecting unit 242 is coupled to a semiconductor processing device which employs the wafer holding apparatus. The semiconductor processing device may be a plasma etching device, a PVD device, a CVD device, an ALD device, an exposure device, a CMP device, and the like. Detecting unit 242 is coupled to the semiconductor processing device to obtain process information of a semiconductor fabrication process. If the semiconductor fabrication process needs to hold or release the wafer, detecting unit 242 transmits a hold or release signal to the calculating unit 243. Detecting unit 242 may be an optical detector, a Bluetooth transceiver, or an infrared transceiver.

Calculating unit 243 is configured to receive the hold or release signal from detecting unit 242. Further, based on the wafer flatness data, the calculating unit 243 may select a power supply mode for each power supply unit to hold or release the wafer smoothly. For example, the calculating unit 243 may control the power supply unit to reduce the intensity of the supplied power based on the flatness data stored in data reception and storage unit 241, so that the wafer held by the electrostatic chuck may be released smoothly.

The data reception and storage unit 241 may store multiple power supply modes to reduce the intensity of the voltages in advance. After receiving the release signal, calculating unit 243 may select a suitable power supply mode among the pre-stored ones for each of the plurality of power supply units to reduce the intensity of the voltages.

Additionally or optionally, the control unit 240 may also include an input device 244. The input device 244 may include a touch screen, a mouse, a keyboard, or combinations thereof. A suitable power supply mode to reduce the intensity of supplied power may be set through input device 244, so that calculating unit 243 is controlled to select a power supply mode for each of the plurality of power supply units to reduce the intensity of power supply, whereby the wafer may be de-chucked by the electrostatic chuck smoothly and gradually.

The control unit according to the embodiments of the present disclosure may control each of the power supply units independently to reduce or stop applying voltage, and may select a power supply mode to reduce the intensity of the voltages based on the wafer flatness data, whereby the wafer may be de-chucked by the electrostatic chuck smoothly.

The data reception and storage unit according to the embodiments of the present disclosure may store the flatness data of the wafer and transmit the flatness data to the control unit, so that the control unit may select a power supply mode which matches with the flatness data to reduce the intensity of voltages, which enables the electrostatic chuck to release the wafer smoothly, thereby reducing the risk of particle contamination.

Further, according to the embodiments of the present disclosure, multiple power supply modes may be stored in the data reception and storage unit. Based on the flatness data of the wafer, the calculating unit may select a power supply mode to reduce the intensity of voltages, which enables the electrostatic chuck to release the wafer smoothly, thereby reducing the risk of particle contamination.

Figure 17:
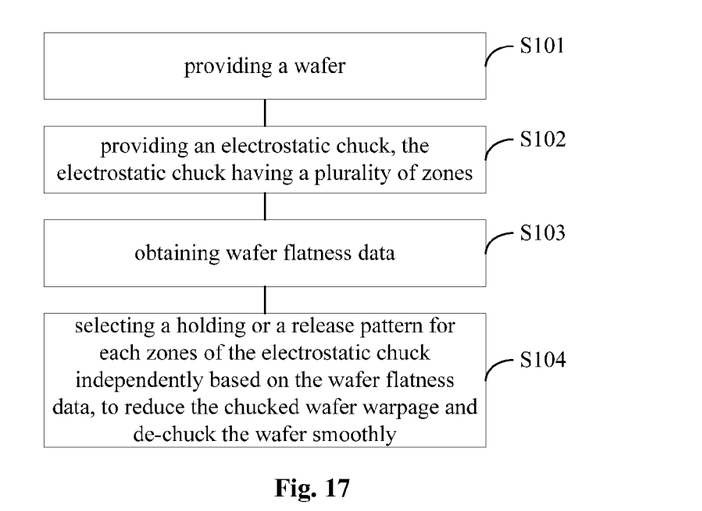
FIG. 17 is a flow chart of a wafer holding method according to one embodiment of the present disclosure.

Returning to FIG. 2, during operation, the control unit 240 may perform a control process to control each power supply unit independently based on the flatness data of the loaded wafer, and to select a power supply mode which matches with the flatness data to start or stop applying a voltage to a corresponding zone. FIG. 17 illustrates a wafer holding process incorporating the control process performed by the control unit 240.

As shown in FIG. 17, at the beginning, a wafer is provided (S101), and an electrostatic chuck is also provided (S102). The wafer is to be held by the electrostatic chuck for certain fabrication process (e.g. deposition, etch, or photolithographic) by a semiconductor processing device. The wafer may have a size of 300 mm, 450 mm, or even larger, and semiconductor devices are formed on the wafer surface. The electrostatic chuck has a plurality of concentric zones to hold the wafer.

Further, the wafer flatness data is obtained (S103). As described previously, the wafer flatness data can be obtained through a wafer flatness measuring unit. After receiving the wafer flatness data, the wafer holding apparatus (e.g., the control unit) may select a holding pattern or a release pattern for each of the plurality of zones of the electrostatic chuck independently based on the wafer flatness data to reduce the chucked wafer warpage and to de-chuck the wafer smoothly (S104).

A holding pattern or release pattern, as used herein, refers to a pattern for applying or removing a binding force between the wafer and an electrode arranged in electrostatic chuck (i.e., the binding force of a zone) gradually such that the wafer is chucked or de-chucked with insignificant amount of particle contamination.

Figure 8:
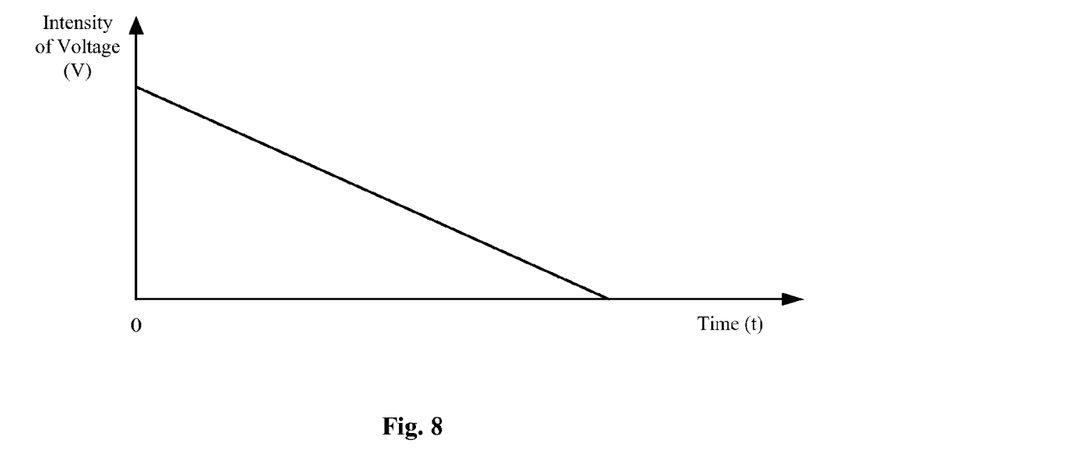
FIG. 8 is a schematic view illustrating the turning-off intensity in a linear descending pattern of various zones in the electrostatic chuck according to one embodiment of the present disclosure.

The binding force may be a Coulomb force or a Johnsen-Rahbek force generated between the wafer and the electrode by, for example, applying a voltage to the electrode. The holding pattern or the release pattern for each zone of the electrostatic chuck may be selected independently based on the wafer flatness data. FIG. 8 illustrates an exemplary release pattern.

As shown in FIG. 8, the control unit 240 may control each of the power supply units to reduce the intensity of the voltage in a linear descending pattern gradually until the power supply is stopped. A slope of the linear descending line in FIG. 8 represents descending rate of the intensity of the power supply. The slopes of the lines to various zones may be the same or different, which may be configured based on the wafer flatness data.

For example, very large wafers tend to have large bows from film stress. Depending on the stress types, a uniform compressive stress or a uniform tensile stress, the wafer may have an upward or a downward bow at the wafer center. For non-uniform stress, there can be multiple bows on the wafer. Therefore, it is preferred to have proper voltages applied to corresponding zones of the e-chuck to generate smooth chucking and dechucking sequences.

When chucking the wafer onto the e-chuck, if the wafer edge is higher than the wafer center, the supplied voltages may start from one side and move to another side to gradually "iron out" the bow. Or, for the concentric zones (i.e., radically symmetric zones), the supplied voltages may start from the edge and move to the center of the wafer to gradually flatten the wafer. Optionally, if applying a voltage to a corresponding zone takes a period of time using a holding pattern, the rate of increasing the voltage level may be controlled such that the rate for the edge zone is higher than the rate of the center zone to achieve the gradual flattening effect. To apply the same voltage to all zones at the same time may cause wafer-chuck scratches, resulting in particle generation at the wafer backside A similar sequence may apply to the dechucking process. If wafer edge is higher than the wafer center, the applied voltages may be removed starting from the center and move to the edge of the wafer to gradually release the wafer. Optionally, if reducing a voltage to a corresponding zone takes a period of time using a release pattern, the rate of reducing the voltage level may be controlled such that the rate for the center zone is higher than the rate of the edge zone to achieve the gradual release effect. To remove the same voltage to all zones at the same time may cause wafer-chuck scratches, resulting in particle generation at the wafer backside.

In certain embodiments, if a wafer is bowed downward, i.e., the wafer edge is lower than the wafer center, the voltage can be applied to the center zone first and gradually applied to zones farther away from the center in a concentric fashion. Or the rate of increasing the voltage level may be controlled such that the rate for the center zone is higher than the rate of the edge zone to achieve the gradual flattening effect. The wafer is chucked smoothly from center to edge without much scratching with the chuck scratches. In a similar manner, the wafer may be de-chucked from edge to center smoothly, and particles generated from wafer scratching on the surface of the electrostatic chuck may be avoided.

FIG. 9 illustrates an exemplary holding pattern consistent with the disclosed embodiments. As shown in FIG. 9, control unit 240 may control each of the power supply units to increase the intensity of the voltage in a linear ascending way gradually until chucking the wafer tightly. The slopes of the lines for various zones may be the same or different, which may be configured based on the wafer flatness data.

For example, if the wafer edge is lower than the wafer center, the supplied voltages may be increased quickly near the center of the electrostatic chuck 201, while the supplied voltages may be increased slowly near the outer edge of the electrostatic chuck 201.

Figure 10:
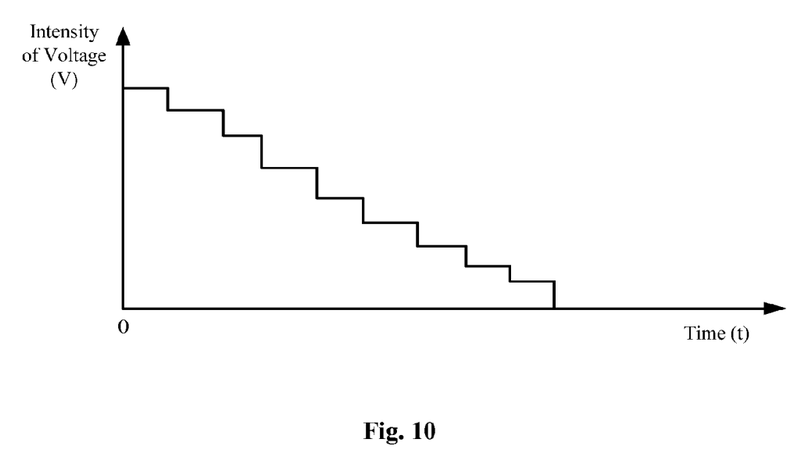
FIG. 10 is a schematic view illustrating the turning-off intensity in a multi-step descending pattern of various zones in the electrostatic chuck according to one embodiment of the present disclosure.

FIG. 10 illustrates another exemplary release pattern consistent with the disclosed embodiments. As shown in FIG. 10, control unit 240 may control each of the power supply units to increase or decrease the intensity of the voltages in a series of steps gradually until the proper voltage is reached. The step-descending lines to various zones may be the same or different, which may be configured based on the wafer flatness data. For example, very large wafers tend to have large bows from film stress. Further, the control unit 240 may also determine a size of each step (e.g., corresponding a step of voltage value) based on the time period for de-chucking the wafer and the value of the current voltage.

It should be noted that the power supply mode in the multi-step descending pattern is beneficial to de-chuck the wafer smoothly in the course of reducing voltages, thus it is more effective to reduce particles generated from wafer scratching on the surface of the electrostatic chuck.

Figure 11:
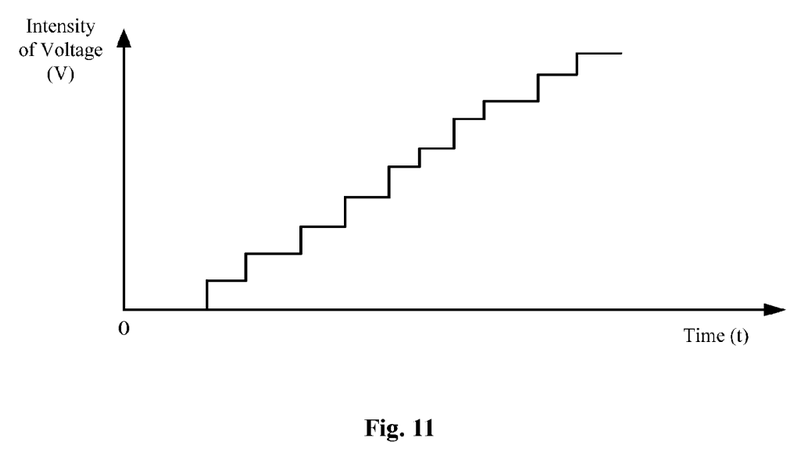
FIG. 11 is a schematic view illustrating the turning-on intensity in a multi-step ascending pattern of various zones in the electrostatic chuck according to one embodiment of the present disclosure.

FIG. 11 illustrates another exemplary holding pattern consistent with the disclosed embodiments. As shown in FIG. 11, control unit 240 may control each of the power supply units to increase the intensity of the supplied power in a multi-step ascending pattern gradually until the wafer is chucked tightly. The step-ascending lines to increase voltages to various zones may be the same or different, which may be configured based on the wafer flatness data. For example, if the wafer edge is lower than the wafer center, the supplied voltages may be increased quickly near the center of the electrostatic chuck 201, while the supplied voltages may be increased slowly near the outer edge of the electrostatic chuck 201. The control unit 240 may also determine a size of each step (e.g., corresponding a step of voltage value) based on the time period for chucking the wafer and the value of the applied voltage.

Figure 12:
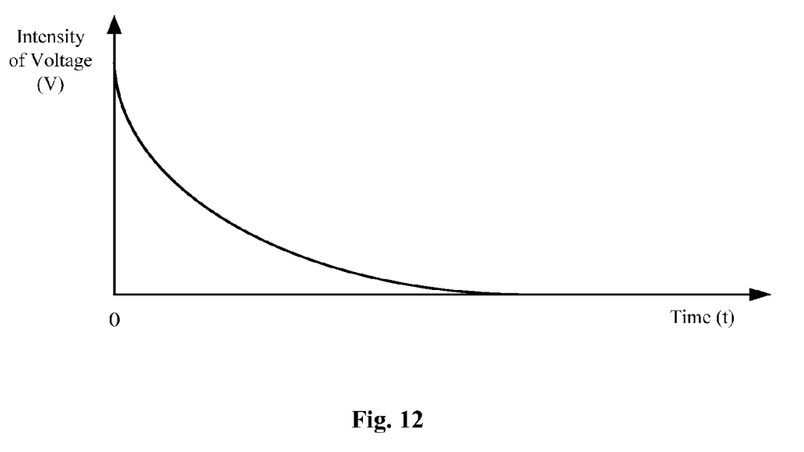
FIGS. 12 and 13 are schematic views illustrating the turning-off intensity in a curved descending pattern of various zones in the electrostatic chuck according to one embodiment of the present disclosure.
Figure 13:
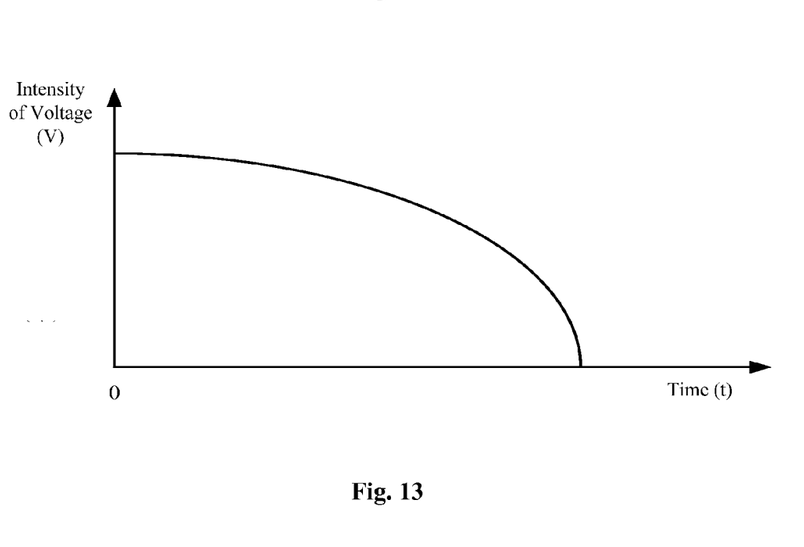

FIGS. 12 and 13 illustrate other exemplary release patterns consistent with the disclosed embodiments. As shown in FIGS. 12 and 13, control unit 240 may control each of the power supply units to decrease the intensity of the voltages in a curved descending pattern gradually until the power supply is off The curved lines to reduce voltages to various zones may be the same or different. The control unit 240 may determine the descending rate of the curve based on the individual flatness data, similar to FIGS. 8 and 10.

Figure 14:
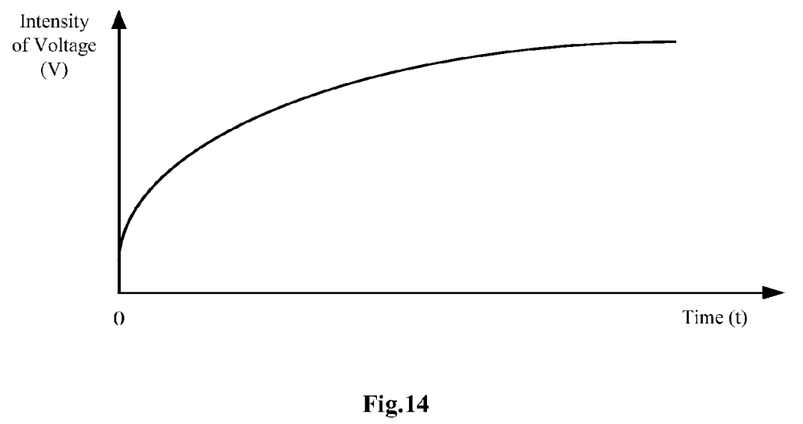
FIGS. 14 and 15 are schematic views illustrating the turning-on intensity in a curved ascending pattern of various zones in the electrostatic chuck according to one embodiment of the present disclosure.
Figure 15:
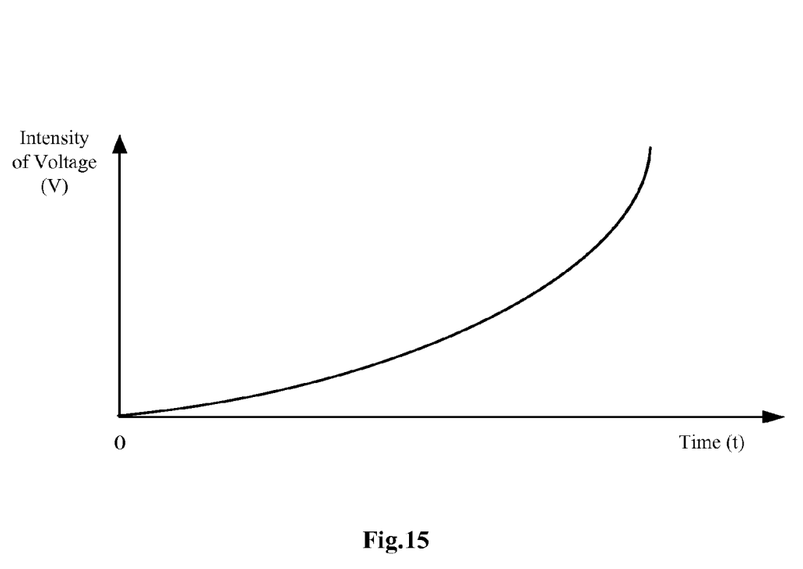

FIGS. 14 and 15 illustrate other exemplary holding patterns consistent with the disclosed embodiments. As shown in FIGS. 14 and 15, control unit 240 may control each of the power supply units to increase the intensity of the voltages in a curved ascending pattern gradually until the wafer is chucked tightly. The curved lines to increase voltages to various zones may be the same or different. The control unit 240 may determine the ascending rate of the curve based on the individual flatness data, similar to FIGS. 9 and 11.

Returning to FIG. 17, it also should be noted that, after obtaining the wafer flatness data, each of the power supply units is separately controllable by the control unit 240 to select a suitable power supply mode (e.g., corresponding to a holding or release pattern) to increase or reduce the intensity of voltages until the desired voltage is applied. For example, a multi-step descending pattern may be employed to reduce the voltage intensity for the first zone, a linear descending way may be employed for the second zone, and a curved descending way may be employed for the third zone. The de-chucking voltage for each zone is separately controllable, thus the wafer may be de-chucked by the electrostatic chuck more smoothly, consequently reducing the risk of particle contamination.

Further, according to the embodiments of the present disclosure, multiple ways of increasing or reducing the intensity of voltages may be stored in the data reception and storage unit of the control unit. Based on the flatness data of the wafer, the calculating unit of the control unit may select a power supply mode to increase or reduce the intensity of voltages, which enables the electrostatic chuck to hold or release the wafer smoothly, thereby reducing the risk of particle contamination.

By using the disclosed methods and apparatus, many advantageous applications may be implemented. For example, after obtaining the wafer flatness data, each of the power supply units is separately controllable by the control unit to select a suitable power supply mode to increase or reduce the intensity of voltages until the desired voltage is applied. For example, a multi-step descending way is employed to reduce voltage intensity for the first zone, a linear descending way is employed for the second zone, and a curved descending way is employed for the third zone. The de-chucking voltage for each zone is separately controllable, thus the wafer may be de-chucked by the electrostatic chuck more smoothly, consequently reducing the risk of particles generation.

The control unit may control each of the power supply units independently to reduce or stop applying the relevant voltage. When de-chucking the wafer held by the electrostatic chuck, the control unit may select a power supply mode for each of the power supply units to reduce intensity of voltages based on wafer flatness data, so that the wafer is de-chucked smoothly.

The data reception and storage unit according to the embodiments of the present disclosure may store wafer flatness data. When de-chucking the wafer held by the e-chuck, the flatness data is transmitted to the control unit so that the control unit can select a power supply mode matching with the wafer flatness data to reduce intensity of voltages. Therefore, the wafer will return into a warpage state smoothly, which consequently reduces the risk of particle generation from wafer backside scratching with the e-chuck in the course of regaining warpage.

The method for holding a wafer according to one embodiment of the present disclosure can select a release pattern independently to de-chuck the wafer for each zones of the electrostatic chuck based on the wafer flatness data, so that the wafer is released smoothly and gradually, which avoids particle contamination in the course of regaining warpage.

Although the present disclosure has been disclosed above with reference to specific embodiments thereof, it should be understood that the disclosure is presented by way of example only, and not limitation. Those skilled in the art can modify and vary the embodiments without departing from the spirit and scope of the present disclosure.

What is claimed is:

1. A wafer holding apparatus, comprising:
an electrostatic chuck having a plurality of zones to hold a wafer;
a plurality of power supply units, each adapted for applying a voltage to one of the plurality of zones of the electrostatic chuck independently; and
a control unit adapted for controlling each of the plurality of power supply units independently to independently apply the voltage to a corresponding zone of the electrostatic chuck using a holding pattern and a release pattern for each zone of the plurality of zones determined based on flatness data of the wafer,
wherein the control unit controls each of the power supply units independently to independently apply a voltage to a center zone first and then to independently apply a voltage to an edge zone, such that the wafer is gradually flattened from the center zone to the edge zone when an edge of the wafer is lower than a center of the wafer.

2. The wafer holding apparatus according to claim 1, wherein:
when an edge of the wafer is lower than a center of the wafer, to release the wafer, the control unit controls each of the power supply units to remove a voltage from an edge zone first and then to remove a voltage from a center zone such that the wafer is gradually released from the edge zone to the center zone.

3. The wafer holding apparatus according to claim 1, wherein the control unit controls each of the power supply units to reduce intensity of the voltage in a linear descending pattern gradually until the wafer is fully released.

4. The wafer holding apparatus according to claim 1, wherein the control unit controls each of the power supply units to reduce the intensity of the voltage in a multi-step descending pattern gradually until the power supply is off.

5. The wafer holding apparatus according to claim 1, wherein the control unit controls each of the power supply units to reduce intensity of the voltage in a curved descending pattern gradually until the power supply is off.

6. The wafer holding apparatus according to claim 1, further comprising a wafer flatness measuring unit configured to measure the flatness data of the wafer and to send the flatness data of the wafer to the control unit.

7. The wafer holding apparatus according to claim 1, wherein the control unit comprises:
- a data reception and storage unit adapted for receiving and storing the wafer flatness data;
- a calculating unit; and
- a detecting unit connected to a semiconductor processing device and adapted for obtaining process data of a semiconductor fabrication process and transmitting a release signal to the calculating unit if the semiconductor fabrication process indicates to release the wafer,
- wherein the calculating unit is adapted for receiving the release signal from the detecting unit, and selecting a power supply mode for each of the power supply units to reduce intensity of voltages based on the flatness data stored in the data reception and storage unit, such that the wafer held by the electrostatic chuck is released smoothly.

8. The wafer holding apparatus according to claim 7, wherein the detecting unit is one of an optical detector, a Bluetooth transceiver, and an infrared transceiver.

9. The wafer holding apparatus according to claim 7, wherein the electrostatic chuck comprises a center zone and an outer zone.

10. The wafer holding apparatus according to claim 9, wherein the center zone and the outer zone are concentric; the center zone is a circular area which is at the center of the electrostatic chuck and has a radius less than that of the electrostatic chuck, and the remaining ring area is the outer zone.

11. The wafer holding apparatus according to claim 1, wherein the electrostatic chuck comprises a center zone, an outer zone, and an intermediate zone between the center zone and the outer zone.

12. The wafer holding apparatus according to claim 11, wherein the center zone, the intermediate zone and the outer zone are concentric; the center zone is a circular area which is at the center of the electrostatic chuck and has a radius less than that of the electrostatic chuck, the intermediate zone is a part of ring area except the center zone, and the remaining ring area is the outer zone.

13. A method for holding a wafer, comprising:
providing a wafer;
providing an electrostatic chuck having a plurality of zones to hold the wafer by a binding force;
obtaining flatness data of the wafer; and
selecting one of a holding pattern and a release pattern for each of the plurality of zones of the electrostatic chuck independently based on the flatness data of the wafer to control each of a plurality of power supply units independently to apply a voltage to a corresponding zone of the electrostatic chuck using the selected holding or release pattern based on flatness data of the wafer, wherein each of the power supply units is controlled to independently apply a voltage to a center zone first and then to independently apply a voltage to an edge zone such that the wafer is gradually flattened from the center zone to the edge zone, when an edge of the wafer is lower than a center of the wafer.

14. The method according to claim 13, wherein the electrostatic chuck comprises a center zone and an outer zone; the center zone being a circular area which is at the center of the electrostatic chuck and has a radius less than that of the electrostatic chuck, and the remaining ring area being the outer zone.

15. The method according to claim 13, wherein: the electrostatic chuck comprises a center zone, an outer zone, and an intermediate zone between the center zone and the outer zone; and the center zone is a circular area which is at the center of the electrostatic chuck and has a radius less than that of the electrostatic chuck, the intermediate zone is a part of ring area except the center zone, and the remaining ring area is the outer zone.

16. The method according to claim 13, wherein the binding force comprises a Coulomb force or a Johnsen-Rahbek force generated between the wafer and a plurality of electrodes arranged in electrostatic chuck when voltages are applied on the electrodes by the power supply units.

17. The method according to claim 13, wherein the holding or release pattern for each of the plurality of zones of the electrostatic chuck is one of a linear descending or ascending pattern, a multi-step descending or ascending pattern, and a curved descending or ascending pattern.

18. The apparatus according to claim 1, wherein the holding pattern includes a pattern for applying a binding force between the wafer and an electrode arranged in each zone of the plurality of zones of the electrostatic chuck.

19. The apparatus according to claim 1, wherein the release pattern includes a pattern for removing a binding force between the wafer and an electrode arranged in each zone of the plurality of zones of the electrostatic chuck.

* * * * *